US008555221B2

(12) United States Patent
Moffitt et al.

(10) Patent No.: US 8,555,221 B2
(45) Date of Patent: *Oct. 8, 2013

(54) PARTITIONING FOR HARDWARE-ACCELERATED FUNCTIONAL VERIFICATION

(75) Inventors: Michael D. Moffitt, Austin, TX (US); Matyas A. Sustik, Austin, TX (US); Paul G. Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/590,115

(22) Filed: Aug. 20, 2012

(65) Prior Publication Data
US 2012/0317527 A1 Dec. 13, 2012

Related U.S. Application Data

(63) Continuation of application No. 12/949,328, filed on Nov. 18, 2010, now Pat. No. 8,327,304.

(51) Int. Cl.
G06F 17/50 (2006.01)
(52) U.S. Cl.
USPC ............ 716/108; 716/106; 716/100; 716/101
(58) Field of Classification Search
CPC .. G06F 17/50; G06F 17/5072; G06F 17/5077
USPC ........ 716/118–119, 122, 127, 131, 100–101, 716/106, 108
See application file for complete search history.

(56) References Cited

U.S. PATENT DOCUMENTS

| 5,784,290 | A | 7/1998 | Kung et al. |
| 6,615,211 | B2 * | 9/2003 | Beygelzimer et al. ................ 1/1 |
| 6,836,753 | B1 * | 12/2004 | Silve ................................ 703/2 |
| 7,010,763 | B2 * | 3/2006 | Hathaway et al. ............ 716/132 |
| 7,219,048 | B1 * | 5/2007 | Xu ................................... 703/19 |
| 7,873,926 | B2 * | 1/2011 | Buck et al. .................... 716/113 |
| 2004/0044979 | A1 | 3/2004 | Aji et al. |
| 2007/0245281 | A1 | 10/2007 | Riepe et al. |
| 2008/0216038 | A1 * | 9/2008 | Bose ................................ 716/8 |

OTHER PUBLICATIONS

Alpert, C. J. et al., "Multilevel Circuit Partitioning," Proceedings of the 34th Design Automation Conference, pp. 530-533 (1997).

(Continued)

*Primary Examiner* — Stacy Whitmore
(74) *Attorney, Agent, or Firm* — Matthew W. Baca; Jack V. Musgrove

(57) ABSTRACT

A circuit design is partitioned for hardware-accelerated functional verification using a directed hypergraph with edge weights that are a function of slack. Slack may be computed as the difference between the early and late ranks for the source of an edge. The weight may further be computed as the difference between the edge's slack and a maximum slack value. In a preferred implementation each vertex also has multiple weights associated with resource requirements of different node types, and the partitioning is constrained to prevent vertex movement that would result in vertex weights for a given partition exceeding a partition resource capacity based on the accelerator architecture. Edge and vertex weights can be recomputed for the next level of partitioning. The partitioning process can be repeatedly iteratively until a termination criterion is met, the termination criterion being based in part on the number of directed cuts in each of the partitions.

14 Claims, 4 Drawing Sheets

(56) References Cited

OTHER PUBLICATIONS

Chamberlain, R. D., "Parallel Logic Simulation of VLSI Systems," Proceedings of the 32nd Design Automation Conference, pp. 139-143 (1995).

Hering, K. et al, "Parameterized Partition Valuation for Parallel Logic Simulation," Proceedings of the Parallel and Distributed Computing and Networks, pp. 144-150 (1997).

Hering, K. et al., "Cone Clustering Principles for Parallel Logic Simulation," Proceedings of the 10th International Symposium on MASCOTS, pp. 93-100 (2002).

Karypis, G. et al, "Multilevel Hypergraph Partitioning: Applications in VLSI Domain," Proceedings of the 34th Design Automation Conference, pp. 526-529 (1997).

Kim, Y.-I. et al, "TPartition: Testbench Partitioning for Hardware-Accelerated Functional Verification," IEEE Design & Test of Computers, vol. 21, No. 6, pp. 484-493 (2004).

Papa, D. A. et al., "Hypergraph Partitioning and Clustering," Approximation Algorithms and Metaheuristics (2007).

Patil, S. et al, "Efficient Circuit Partitioning Algorithms for Parallel Logic Simulation," Proceedings of the 1989 Conference on Supercomputing, pp. 361-370 (1989).

Smith, R. J. II., "Fundamentals of Parallel Logic Simulation," Proceedings of the 23rd Design Automation Conference, pp. 2-12 (1986).

Soulé, L. et al, "Parallel Logic Simulation on General Purpose Machines," Proceedings of the 25th Design Automation Conference, pp. 166-171 (1988).

Sporrer, C. et al, "Corolla Partitioning for Distributed Logic Simulation of VLSI-Circuits," Proceedings of the 7th Workshop on Parallel and Distributed Simulation, pp. 85-92 (1993).

Zhu, L. et al., "Parallel Logic Simulation of Million-Gate VLSI Circuits," Proceedings of the 13th International Symposium on MASCOTS, pp. 521-524 (2005).

* cited by examiner

_US 8,555,221 B2_

PARTITIONING FOR HARDWARE-ACCELERATED FUNCTIONAL VERIFICATION

CROSS-REFERENCE TO RELATED APPLICATION

This application is a continuation of copending U.S. patent application Ser. No. 12/949,328 filed Nov. 18, 2010.

BACKGROUND OF THE INVENTION

1. Field of the Invention

The present invention generally relates to allocation of computational resources, and more particularly to a method of partitioning an integrated circuit design to enable and optimize parallel simulation of the design.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3).

An IC chip is created by first conceiving the logical circuit description, and then converting that logical description into a physical description, or geometric layout. This process is usually carried out using a netlist, which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The result is a set of design files known as an intermediate form that describes the layout. The design files are then run through a dataprep process that is used to produce patterns called masks by an optical or electron beam pattern generator. During fabrication, these masks are used to etch or deposit features in a silicon wafer in a sequence of photolithographic steps using a complex lens system that shrinks the mask image. The process of converting the specifications of an electrical circuit into such a layout is called the physical design.

Cell placement in integrated circuit design involves a determination of where particular cells should optimally (or near-optimally) be located on a surface of an integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn-around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

It is important to ensure that an integrated circuit design is going to work properly before proceeding with fabrication preparation. A variety of tests can be performed to evaluate the design, but simulation remains the dominant strategy for functionally verifying high-end microprocessors. A design-under-test is driven by vectors of inputs, and states encountered while walking through the sequence are checked for properties of correctness. This process can be (and often is) performed by software simulation tools; however, such programs cannot compete with the cycle times offered by hardware accelerated simulation. Hardware accelerators are custom-built machines that can increase simulation performance by several orders of magnitude, reducing otherwise month-long software simulations to days or even hours. This improvement is due in part to specialized logic processors and instruction memories, but also due to the parallelism inherent in the hardware realization of logic designs. The cost of building and maintaining a fleet of hardware accelerators is typically on the order of millions of dollars, and thus reflects a significant portion of the verification budget.

As models approach the billion-transistor mark, the ability of accelerator capacity to scale with design size is critical to the success of microprocessor verification. To exploit locality, large netlists must be decomposed into smaller groups that span several chips, boards, or systems. Likewise, the evaluation of each gate must be routed to its downstream successors without incurring excessive delay along any one path. These compilation concerns echo many of the problems faced by physical synthesis, a broad subject that concerns the placement and routing of standard cells and macros on silicon to concurrently optimize timing, power, area, etc. For instance, the allocation of gate primitives to discrete resources of the layout—a process known as partitioning—has a rich history in the context of cell placement. The area of a physical chip design is recursively divided into many sub-regions, and gates are grouped and split among these regions to optimize an objective function such as half-perimeter wirelength. The most popular algorithms in the literature are variants of the Fiduccia-Mattheyses technique, which uses hypergraphs. A hypergraph is a generalization of a graph, having vertices which can represent gates or cells, and having hyperedges representing interconnections between the vertices. Hypergraph partitioners used in cell placement typically attempt to minimize the number (or weighted number) of hyperedges cut by the partitionment. A prevalent extension of this algorithm is the Multi-Level Fiduccia-Mattheyses (MLFM) algorithm, which improves both solution quality and runtime of partitioning large hypergraphs by clustering tightly connected components and partitioning the resulting smaller hypergraph using gain-based cell movement and repeated bisection.

The approach taken by prior art placement partitioners does not, however, address the specific needs of partitioning for hardware-accelerated functional verification. A key distinction in the realm of simulation is that the partitioned logic must ultimately be scheduled; hence, the objective of a verification partitioner is not necessarily to reduce cut, but rather to minimize final simulation depth. The output of each gate depends on the result of its inputs, and hence its evaluation must be deferred until after the evaluation of its sources. Classical partitioning ignores such temporal dependencies, and may divide the netlist into a completely unparallelizable quotient. FIG. 1 illustrates an example of how the solution with the best cut for placement can be the worst cut for scheduling. A simplified circuit design 2 is shown which includes a set of twelve early vertices (e.g., gates) 4a, a set of twelve late vertices 4b, and two bottleneck vertices 4c and 4d. The best partitionment 6 for placement (only one cut between the bottleneck vertices) is the worst partitionment in terms of parallelism and is entirely unsuitable for simulation. An optimum partitionment 8 for simulation bisects the sets of early and late vertices, and has a considerably higher cut count (four).

Classical models and methods for partitioning are incapable of distinguishing the temporal distribution of vertices. In addition, minimizing the pure number of nets cut neglects the directionality of the connections, whereas a proper formulation must consider the connectivity limits mandated by the machine architecture. Furthermore, the fundamental building blocks of the accelerator (e.g., its memories, arithmetic logic units, etc.) are often not distributed homogeneously. Specific portions of the netlist, especially arrays, may be restricted to a subset of processing units. These restrictions are further compounded by complex constraints that limit the number of cycles and bits used collectively by those entities. Finally, existing partitioning algorithms fail to account for changes in problem formulation that can occur at intermediate levels; for instance, arrays may be assigned to different memory classes as a result of the partial assignment, and the criticality of edges may also change depending on where in the topology nets are cut. Because existing methods for partitioning fail in each of these cases, they threaten to undermine the ability and efficacy of compiling large models for hardware acceleration.

In light of the foregoing, it would be desirable to devise an improved method of partitioning an integrated circuit design for hardware-accelerated simulation. It would be further advantageous if the method could take into consideration temporal and directional dependencies in the design.

SUMMARY OF THE INVENTION

It is therefore one object of the present invention to provide an improved method of partitioning an integrated circuit design for hardware-accelerated simulation.

It is another object of the present invention to provide such a method which is easily scaled to very large numbers of gates or cells.

It is yet another object of the present invention to provide such a method which takes into account the temporal strata of a design.

The foregoing objects are achieved in a method of partitioning a circuit design for hardware-accelerated functional verification, by receiving a description of the circuit design which includes a plurality of nodes interconnected to form a plurality of nets, constructing a directed hypergraph with vertices representing the nodes and edges representing the nets, one of the vertices in each edge being a source, computing a slack for each edge based on the edge's source, assigning each edge a weight which is a function of the edge's slack, partitioning the hypergraph to create a vertex partition which optimizes a total weighted cut of the edges using the edge weights, and mapping the vertex partitionment to a partitionment of the nodes. The slack may be computed by determining an early rank of the edge's source by performing a forward topological traversal of the circuit design to the edge's source, determining a late rank of the edge's source by performing a backward topological traversal of the circuit design to the edge's source, and computing the slack as the difference of the early and late ranks. The weight of an edge may further be computed as the difference of the edge's slack and a maximum slack value. The edge weight function can assign a minimum edge weight to any edge having a slack greater than a predetermined threshold. The hypergraph can be coarsened by clustering prior to the partitioning, and then refined after the partitioning. In a preferred implementation vertex weights are assigned associated with resource requirements of different node types, and the partitioning is constrained to prevent vertex movement that would result in vertex weights for a given partition exceeding a partition resource capacity based on an architecture of the particular hardware accelerator being used. Partitioning can change delays incurred along the nets, so the edge weights can be recomputed and the hypergraph partitioned again using the recomputed edge weights. This process can be repeatedly iteratively until a termination criterion is met, the termination criterion being based at least in part on the number of directed cuts in each of the partitions.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
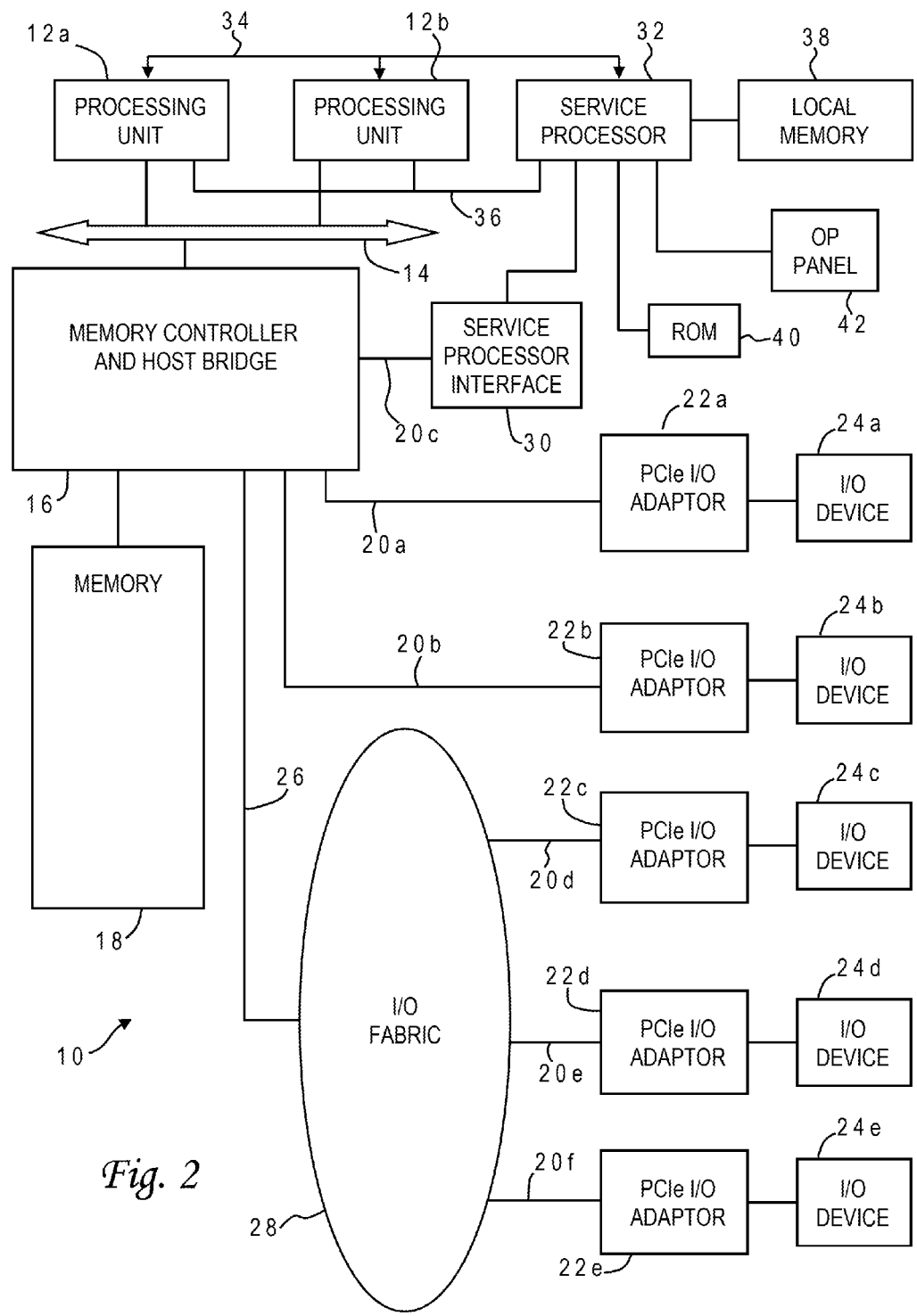
FIG. 2 is a block diagram of a computer system programmed to carry out partitioning of an integrated circuit design for hardware-accelerated functional verification of the design in accordance with one implementation of the present invention.

With reference now to the figures, and in particular with reference to FIG. 2, there is depicted one embodiment 10 of a computer system in which the present invention may be implemented to carry out partitioning of an integrated circuit design for hardware-accelerated functional verification. Computer system 10 is a symmetric multiprocessor (SMP)

system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the partitioning application of the present invention, results of which may be stored in a hard disk drive of the system (an I/O device 24) or on another storage medium. While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such storage media excludes transitory media such as propagating signals.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 10 carries out program instructions for a partitioning process that uses novel hypergraph techniques which explicitly encode directional and temporal dependencies. Accordingly, a program embodying the invention may include conventional aspects of various partitioning tools, and these details will become apparent to those skilled in the art upon reference to this disclosure.

Figure 1:
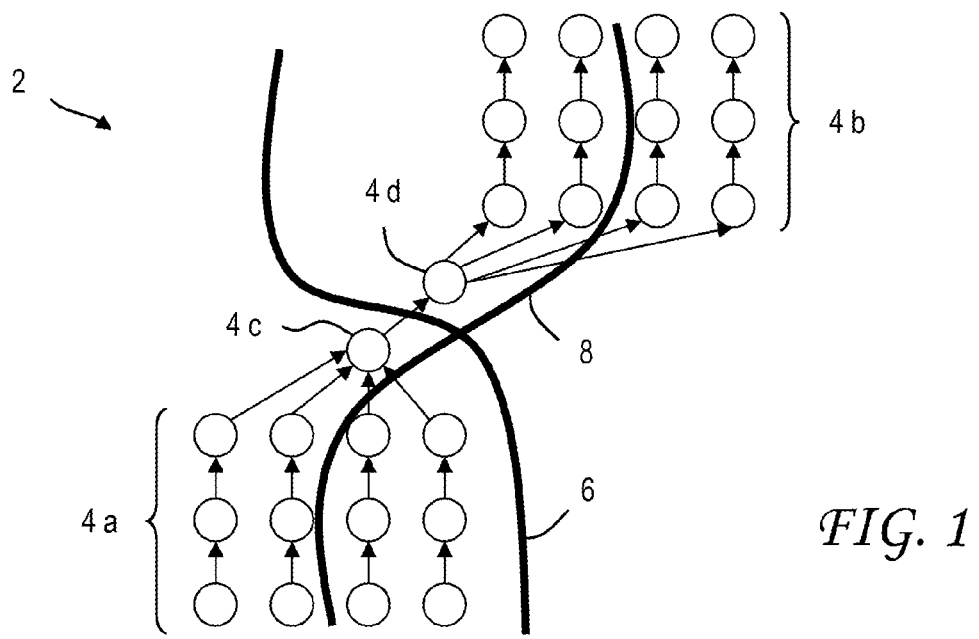
FIG. 1 is a pictorial representation of a circuit design having early gates, late gates, and bottleneck gates, illustrating a preferred cut for placement and a preferred cut for scheduling.
Figure 3:
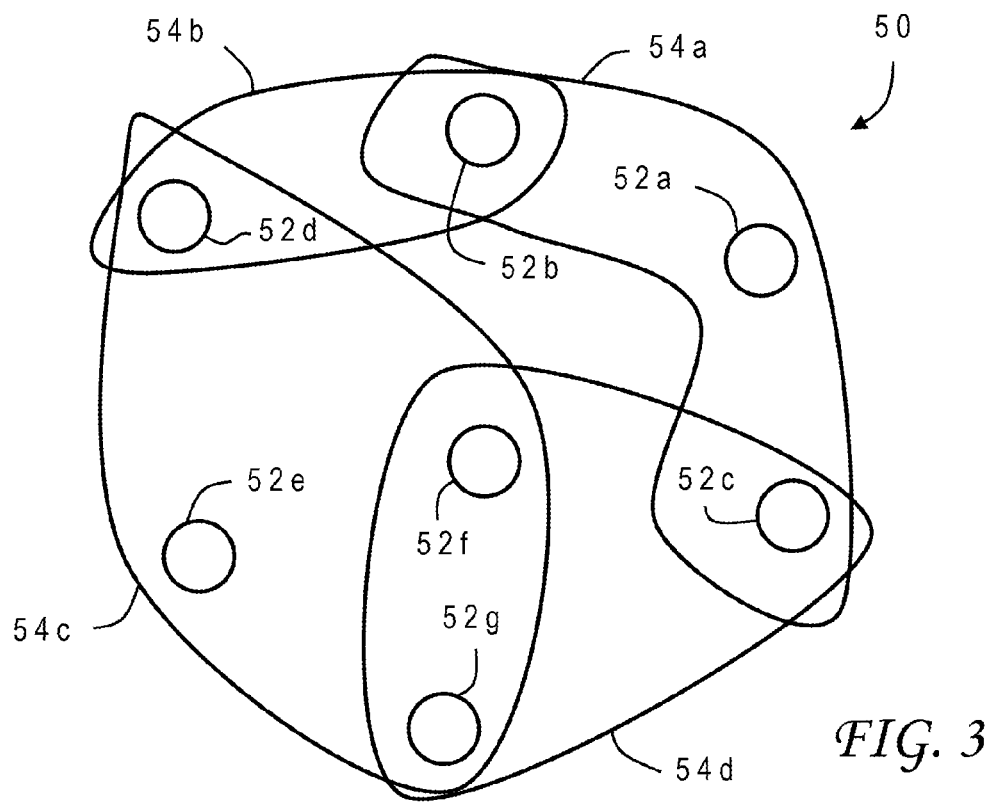
FIG. 3 is a hypergraph having vertices corresponding to gates or arrays of an integrated circuit design and hyperedges corresponding to connections between the vertices, which is to be partitioned in accordance with one implementation of the present invention.

Referring now to FIG. 3, there is depicted a hypergraph 50 representing a simplified layout of an integrated circuit design, or portion thereof, which is to be partitioned for hardware-accelerated functional verification. The partitioning may be global or detailed. Hypergraph 50 has vertices 52a-52g corresponding to nodes of the design (gates, arrays, cells, macros, etc.) and edges (hyperedges) 54a-54d corresponding to nets formed by interconnections between the nodes. In the illustrative embodiment hypergraph 50 is a multidimensional, directed, weighted hypergraph. An edge is directed if exactly one of its vertices is designated as a source; all other vertices constitute the sinks of the edge. The source may be designated by convention as the first element in the edge structure; for example, if the gate corresponding to vertex 52a is the source for the net corresponding to edge 54a, then edge 54a can be denoted as [52a, 52b, 52c]. The hypergraph structure G=(V, E) is defined computationally by the vertex set $V=\{v_1, v_2, \ldots, v_n\}$ and the edge set $E=\{e_1, e_2, \ldots, e_m\}$. The structure can be annotated with various properties including an edge weight function W(E) which maps each edge to a scalar weight. A set of types $T=\{t_1, t_2, \ldots, t_p\}$ can be used to enumerate a set of fixed vertex types. A vertex weight function W(V, T) can map a vertex-type pair to a scalar weight. The problem formulation may additionally utilize a balance function B(I, T) which maps a partition index I and a type T to a maximum capacity. All of these features are discussed in further detail below.

A k-way partition $P=\{C_1, C_2, \ldots, C_k\}$ is defined as a set of k mutually exclusive subsets of V (referred to as partitions) such that Union$(C_1, C_2, \ldots, C_k)$=V. An edge e has support in a partition $C_i$ if the intersection of e and $C_i$ is nonzero. An edge is cut if it has support in multiple partitions of a partitionment. For a given hypergraph G and a k-way partition P, the total cut is defined as the number of all edges that are cut by the partitioning, and the total weighted cut is the weighted version of this sum, using coefficients drawn from the edge weight function W(E). While the goal of the partitioner may be to minimize total weighted cut, the invention more generally optimizes total weighted cut by reducing the total weighted cut but not necessarily to an absolute minimum value since the cut may only be a local minimum, or due to other considerations such as the balance constraints.

Figure 4:
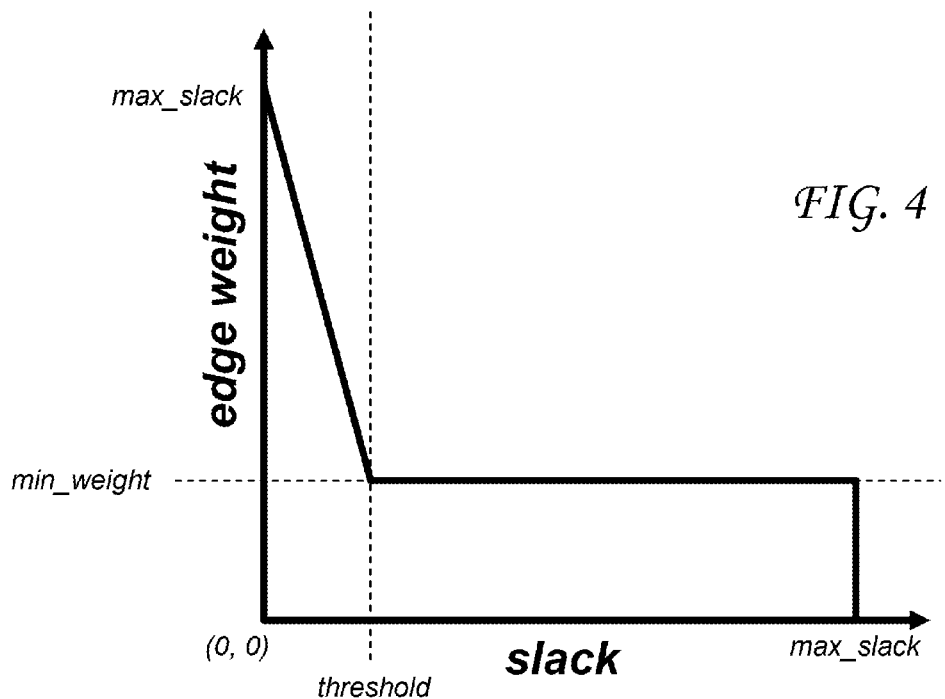
FIG. 4 is a graph illustrating an edge weighting function in accordance with one implementation of the present invention.

In a preferred implementation of the present invention, the edge weights are a function of edge slack based on the source of the edge. Each gate g is annotated with an early rank Er(g) and a late rank La(g), computed by performing forward and backward topological traversals with predetermined delay values for various delay sources (unit delay, gate delay, chip latency, etc.). The slack of an edge can be defined as Slack(e)= La(s(e))−Er(s(e)), where s(e) is the source of the edge. The maximum slack (Max_Slack) is the largest of these values, and generally is also equal to the largest value of La( ) and Er( ). The edge weight function can then be defined as W(e)= Max_Slack−[La(s(e))−Er(s(e))]. The edge weight function thus gives higher weight to nets that are more critical for scheduling, penalizing their cut more heavily than others. This function also makes cutting very noncritical edges almost free which the designer may not desire, so a minimum edge weight can be applied to the edge weight function as shown in FIG. 4. The designer can predetermine a threshold slack value to enforce the minimum edge weight. Rather than being an absolute value, the threshold slack can represent a percentage of the bottom of noncritical nets that are to be assigned the same weight. The threshold slack and minimum weight are generally arbitrary and subject to designer choice. The edge weight function can further be nonlinear.

A ranking system can also be used to partition the logic into strata of temporal classes. For a fixed number S of strata in the circuit design, a temporal mapping M(S): S→[Begin(S), End(S)] maps each stratum s to an interval such that End(s)+

1=Begin(s+1) for any 1≤s≤S. For s=1, Begin(s)=0, and for s=S, End(s)=Max_Er. Each stratum can be encoded as a discrete type in the hypergraph.

Figure 5:
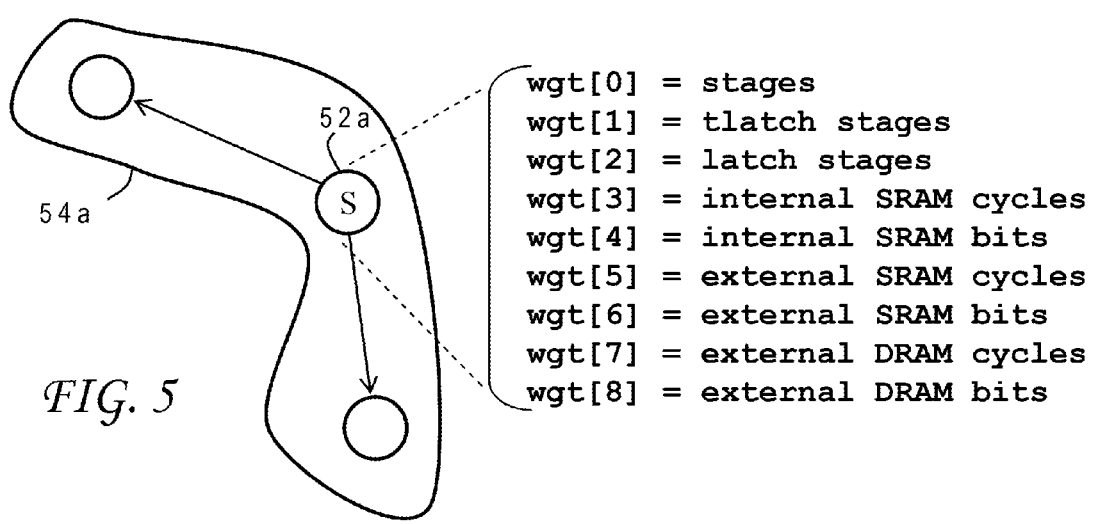
FIG. 5 is a pictorial representation illustrating multidimensional weights for one of the vertices in the hypergraph of FIG. 3 in accordance with one implementation of the present invention.

The vertex weight function used according to a preferred implementation of the present invention may be understood with further reference to FIG. 5. For a gate primitive g and its associated vertex v, the vertex weight function W(v, t) is equal to a positive constant for t=s(g) where s(g) is the temporal stratum of gate (that is, Begin(s(g))≤Er(g)≤End(s(g))). For all other t, W(v, t) is zero. Such a vertex weight function is used to signify the contribution of the gate to a specific temporal region that the gate is likely to be scheduled in. In addition to the types defined by the temporal strata, there can also be types associated with the various resources of the accelerator (e.g., memories, arithmetic logic units, etc.) that vertices may consume. Likewise, the vertex weight function W(v, t) may be positive for any vertex v that consumes the resource of type t. FIG. 5 illustrates the multidimensional weights and exemplary types for source (S) vertex 52a, including number of stages, transparent latch stages, latch stages, internal SRAM cycles, internal SRAM bits, external SRAM cycles, external SRAM bits, external DRAM cycles, and external DRAM bits.

The vertex weights can be used in conjunction with the balance function to optimize hypergraph coarsening and partitioning as discussed further below. The architectural limits of the accelerator are encoded in the balance function B(I, T). The value of B(i, t) for a partition index i and a type t can be derived a number of ways. If t is a temporal stratum type, a threshold parameter may be specified to indicate the amount of tolerance for gates at this level. If t is a resource type, the value may reflect a hard upper-bound on the capacity or throughput of the resource on that partition. As the specification of balance constraints controls a tradeoff between cut/congestion and gate distribution, the proper setting for reducing simulation depth may be derived empirically or analytically.

The hypergraph of FIG. 3 has been simplified for purposes of illustration, but a hypergraph for a state-of-the-art microprocessor design will be extremely complex. In order to ease the computational requirements for partitioning, a very large hypergraph can be coarsened by clustering vertices and consolidating the cluster into a single new vertex. Clustering may be repeated at multiple levels until the number of vertices and edges becomes manageable. The number of cluster levels should be large enough to present ample opportunities to escape local minima during the iterative partitioning process. A random initialization may be used for the coarsest graph, or an initialization can be chosen having the fewest violations and then the fewest cuts or weighted cuts. The clustering scheme preferably collapses high weight edges to prevent cutting critical paths, and collapses low-degree edges which are more likely to remain uncut. Most preferably, no cluster ever becomes larger (in any dimension) than half the maximum size of any partition, and mutually exclusive types (e.g., external SRAM and external DRAM) never merge. The coarsening process may employ the Multi-Level Fiduccia-Mattheyses (MLFM) algorithm, with gain-based movement performed on the coarsened hypergraph. The invention can, however, be implemented with any clustering scheme including classical edge coarsening which collapses at most two nodes at a time, hyperedge coarsening which collapses only entire hyperedges (any edge which spans some vertices that have already been condensed are left intact), modified hyperedge coarsening which further clusters any singleton vertices of all partial hyperedges that may remain, or union-find coarsening which may collapse multiple nodes but does not necessarily condense entire edges or hyperedges. After the coarsened hypergraph is partitioned, cluster assignments are projected onto refined hypergraphs.

The present invention can advantageously perform hypergraph coarsening while enforcing appropriate constraints over node aggregation so as to honor the balance function B(I, T) and the multidimensional vertex weight function W(V, T). For a candidate clustering $C(v_1, v_2, \ldots, v_n)$ (which may be invoked by any of the above proposed methods), a cluster weight summation is constructed as $W(C, T)=W(v_1, T)+W(v_2, T)+\ldots+W(v_n, T)$. In cases where the nodes being merged themselves represent clusters of vertices (as is the case during union-find clustering), the same cluster weight function is used to compute and cache their collective typed weights. For a given vector parameter R(T), a candidate clustering is rejected if for any T, the property $W(C, T) \geq R(T)$ holds true. The vector parameter R(T) represents any multidimensional balance constraint; for instance, it may be derived from the maximum value of B(I, T) across all I, or a dampened multiple of that value. In the case that some types are mutually exclusive (e.g., if one resource is present on a partition only when another is absent), nodes with nonzero weights for one type may be precluded from combining with those of another (as the cluster resulting from their union is unrealizable).

Other interactions between the coarsening and the balance conditions are possible; for instance, the biasing of node selection may be made to favor (or avoid) clusters of a specific size along one or more dimensions. The multidimensional coarsening constraint prohibits the aggregation of vertices that exceed the limits of the specification, and thus honors both the temporal and raw capacity limits of the domain as encoded in the balance condition (i.e., the model of the architecture for the hardware accelerator). The vertex weights of any coarsened hypergraph k+1 (derived from the finer hypergraph k) are drawn from this same cluster weight function.

Gain-based partitioning is a process whereby vertices are dynamically ordered based on their contribution to the objective function, and moved one-at-a-time (in the context of multilevel partitioning, these vertices may represent clusters of nodes from a finer graph, although this representation may not be observable to the base partitioner). For the present invention, the objective function is the total weighted cut using the edge weights based on slack. Nodes with high gain are preferred over those with low gain, where positive gain indicates a strict improvement to the total weighted cut.

For the multidimensional hypergraph, special care can be taken as vertices are moved between partitions; violations to the overall balance function B(I, T) may invalidate any progress made during gain-based movement. A multidimensional demand[ ] vector for each partition can be established and maintained to store the aggregate demand of its nodes. When a vertex v is moved between from_part and to_part, balance updates can be calculated for each type t by subtracting W(v,t) from demand[from_part], and adding W(v, t) to demand[to_part]. The demand[ ] vector may be used in any number of ways to ensure compliance with balance constraints. For example, any move that creates violations (or increases their number) may be rejected outright, or they may be allowed as intermediate solutions but precluded from being saved or cached as potential local optima.

In order to prevent and repair constraint violation during node movement, the gain buckets maintained during partitioning may be indexable based on type. A vertex that has nonzero demand for several types may be inserted into multiple gain buckets. A traditional cut-minimization approach can be implemented by select from any type-bucket when determining a node to move; alternatively, to remove violations, the choice may be limited to a specific type index on a specific partition.

The present invention can provide additional benefits by incrementally maintaining a directed cut value. In contrast to total cut or total weighted cut (the principal objective tracked by classical min-cut partitioning), a directed cut factors cut contributions into separate counters based on a net's source partition. The source itself may be chosen for movement, complicating the procedure. A variable dircut is associated with each partition and initialized to the weighted number of cuts in the given partition. Each partition maintains a support[ ] vector mapping each edge to the number of vertices in that partition that support the edge, to determine whether the edge is cut. By convention, the first vertex listed in the span of an edge is the source of that edge. When a vertex v is moved from from_part to to_part, the support and directional cut elements can be updated. This approach works not only for simple bisection, but also for the broader case of k-way partitioning. The outer loop of gain-based movement may track the values in each partition's dircut to determine local minima, and may use any combination of total cut, total directed cut, total weighted cut, etc., to establish the termination criteria.

As recursive bisection proceeds at each level of partitioning, two forms of improvement may be performed. Cuts incurred at one level will change the delay incurred along those nets (e.g., from a unit delay to one that reflects the latency between the two partition ranges). These cuts may be used to recalculate rank, slack, criticality, and edge weight. The candidate assignment of vertices to various resources (e.g., the assignment of arrays to memory classes) may also be improved, due to the more accurate knowledge of local distributions. In each case, a traditional standalone partitioning scheme is incapable of reacting to these intermediate changes. The present invention allows for a callback method to enable the core compilation engine to refresh the various properties of the hypergraph, particularly the edge and vertex weights; after level L of partitioning is performed, these callbacks are triggered, and the renewed hypergraph will be used at level L+1 to prevent the cutting of critical paths, as well as the poor allocation of competing resource consumers.

Even when intermediate feedback is passed between the partitioning engine and the core compiler, some decisions may present themselves as poor only in hindsight. With any cut-based objective, the partitioner uses static (and myopic) delays and weights; it may unknowingly cut many paths one time each, or cut the same path many times. For the purposes of simulation and scheduling, the latter possibility may incur prohibitively expensive delays during routing. To avoid this situation, a detailed partitioning step can revisits pairs of (possibly nonconsecutive) partitions to repair "zig-zag" paths, highly congested areas, or any other metric that is observable only at the tail-end of partitioning. Provided that the set of pairs considered is non-overlapping, the detailed partitioning attempts may be performed in parallel.

Figure 6:
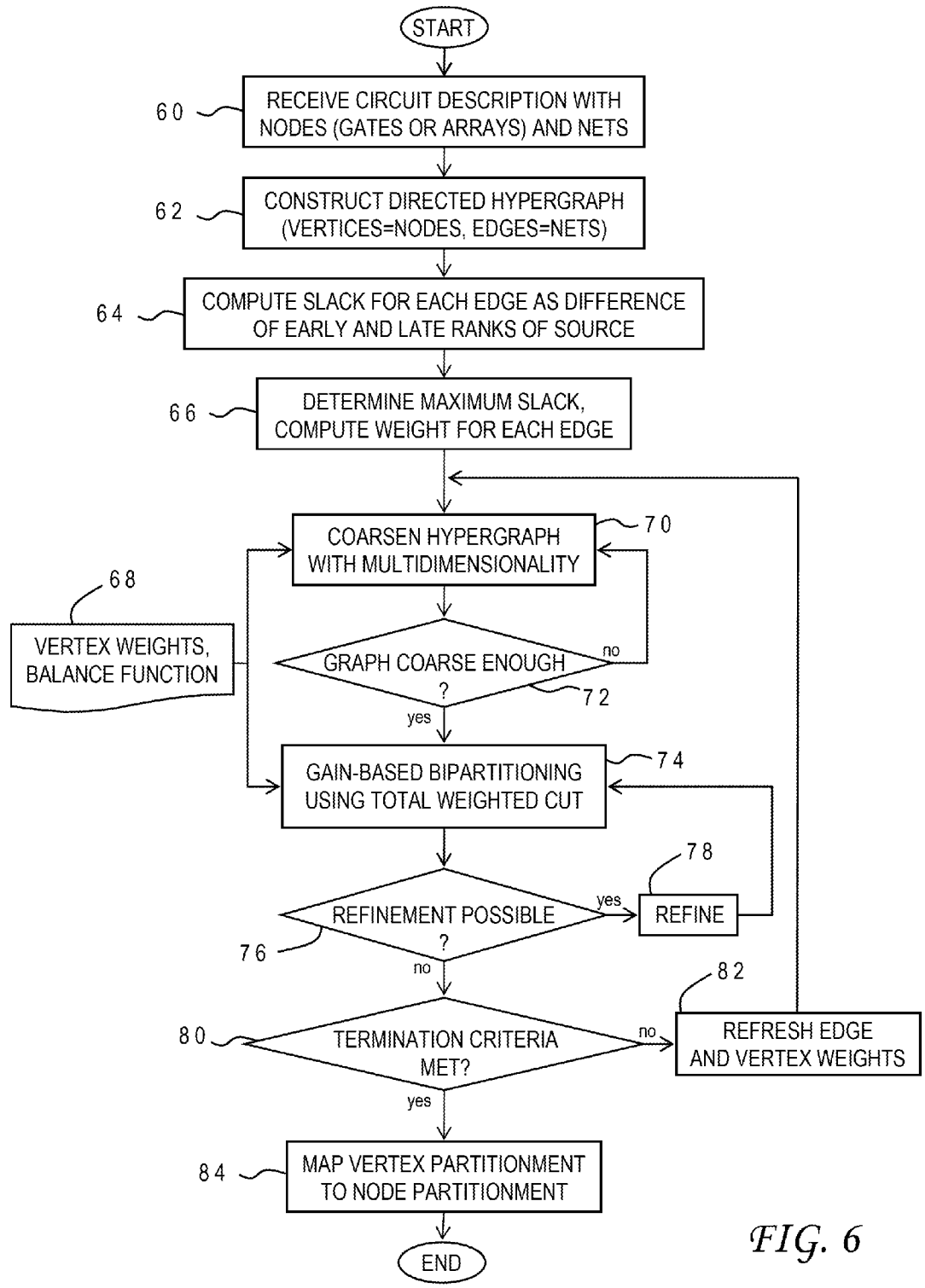
FIG. 6 is a chart illustrating the logical flow for a partitioning process in accordance with one implementation of the present invention.

The invention may be further understood with reference to the chart of FIG. 6 illustrating the flow for one implementation of a partitioning process. The process may be carried out using computer system 10, and begins when computer system 10 receives a netlist or other description of the circuit (60). The netlist identifies the various nodes to be partitioned and how those nodes are interconnected to form nets, including directionality (source/sink information), and the netlist is maintained during compilation. A hypergraph is constructed with vertices representing the nodes of the circuit and edges representing the nets (62). Slack is computed for each edge as the difference of early and late ranks for the source of an edge (64). The maximum slack can then be determined, and weights computed for each edge (66). Vertex weights are provided according to the specifications of the design, and the balance function is provided according to the specifications of the machine (68). The hypergraph is coarsened using clustering, retaining the multidimensional vertex weights (70). The hypergraph may be iteratively clustered at different levels until it is coarse enough (72). Gain-based bipartitioning is then applied to the coarsened hypergraph using total weighted cut (74). A check is then made to see if the partitioned hypergraph can be refined (76). If so, the hypergraph is refined (78), and partitioning is repeated iteratively on the refined hypergraph (74). Once refinement is no longer possible, a further check is made to see if the partitioning leaf level has been reached (80). If not, the edge and vertex weights are refreshed (82), and the process repeats iteratively beginning with hypergraph coarsening (70). Once the partitioning leaf level has been reached, partitioning is complete, and the vertex partitionment is mapped to the nodes of the integrated circuit design (84).

By using edge weights related to net slack, the present invention improves the quality of the finished partitionment for hardware-acceleration purposes, minimizing or greatly reducing simulation depth, without significantly increasing computational requirements. The invention further permits the use of multidimensional vertex weights that correspond to orthogonal types, which helps to preserve the parallelism of assignments by honoring the balance criteria. Intermediate communication between the partitioning engine and the core compiler also allows more accurate rank calculations and memory assignments at lower levels. The result is a very lean core engine, on the order of 1,000 lines of code. In comparison, hMetis (a top academic engine) is on the order of 24,000 lines of code.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A computer-implemented method of partitioning a circuit design for hardware-accelerated functional verification, comprising:

receiving a description of the circuit design which includes a plurality of nodes interconnected to form a plurality of nets, by executing first program instructions in a computer system;

constructing a directed hypergraph with vertices representing the nodes and edges representing the nets, one of the vertices in each edge being a source, by executing second program instructions in the computer system;

computing a slack for each edge based on the edge's source, by executing third program instructions in the computer system;

assigning each edge a weight which is a function of the edge's slack, by executing fourth program instructions in the computer system;

partitioning the hypergraph to create a vertex partitionment which optimizes a total weighted cut of the edges using the edge weights, by executing fifth program instructions in the computer system; and mapping the vertex partitionment to a partitionment of the nodes, by executing sixth program instructions in the computer system.

2. The method of claim 1 wherein the weight of an edge is the difference of the edge's slack and a maximum slack value.

3. The method of claim 1 wherein the edge weight function assigns a minimum edge weight to any edge having a slack greater than a predetermined threshold.

4. A computer system comprising:
one or more processors which process program instructions;
a memory device connected to said one or more processors; and
program instructions residing in said memory device for partitioning a circuit design for hardware-accelerated functional verification by receiving a description of the circuit design which includes a plurality of nodes interconnected to form a plurality of nets, constructing a directed hypergraph with vertices representing the nodes and edges representing the nets, one of the vertices in each edge being a source, computing a slack for each edge based on the edge's source, assigning each edge a weight which is a function of the edge's slack, partitioning the hypergraph to create a vertex partitionment which optimizes a total weighted cut of the edges using the edge weights, and mapping the vertex partitionment to a partitionment of the nodes.

5. The computer system of claim 4 wherein the slack is computed by:
determining an early rank of the edge's source by performing a forward topological traversal of the circuit design to the edge's source;
determining a late rank of the edge's source by performing a backward topological traversal of the circuit design to the edge's source; and
computing the slack as the difference of the early and late ranks.

6. The computer system of claim 4 wherein the weight of an edge is the difference of the edge's slack and a maximum slack value.

7. The computer system of claim 4 wherein the edge weight function assigns a minimum edge weight to any edge having a slack greater than a predetermined threshold.

8. The computer system of claim 4 wherein the hypergraph is coarsened by clustering prior to said partitioning, and further comprising refining the coarsened hypergraph after said partitioning and prior to said mapping.

9. The computer system of claim 4 wherein the nodes are of different types, and further comprising assigning each vertex a plurality of weights associated with resource requirements of the type of its corresponding node, said partitioning being constrained to prevent vertex movement that would result in vertex weights for a given partition exceeding a partition resource capacity which is based on an architecture of a specific hardware accelerator.

10. The computer system of claim 4 wherein said partitioning changes a delay incurred along at least one of the nets, and said program instructions further recompute the edge weights after said partitioning, and partition the hypergraph to create another vertex partitionment which optimizes a total weighted cut of the edges using the recomputed edge weights.

11. The computer system of claim 10 wherein said program instructions further calculate a directed cut for each partition equal to the weighted number of cuts in the partition, and iteratively repeat said recomputing and partitioning until a termination criterion is met, the termination criterion being based at least in part on the number of directed cuts.

12. A computer program product comprising:
a computer-readable storage medium; and
program instructions residing in said storage medium for partitioning a circuit design for hardware-accelerated functional verification by receiving a description of the circuit design which includes a plurality of nodes interconnected to form a plurality of nets, constructing a directed hypergraph with vertices representing the nodes and edges representing the nets, one of the vertices in each edge being a source, computing a slack for each edge based on the edge's source, assigning each edge a weight which is a function of the edge's slack, partitioning the hypergraph to create a vertex partitionment which optimizes a total weighted cut of the edges using the edge weights, and mapping the vertex partitionment to a partitionment of the nodes.

13. The computer program product of claim 12 wherein the weight of an edge is the difference of the edge's slack and a maximum slack value.

14. The computer program product of claim 12 wherein the edge weight function assigns a minimum edge weight to any edge having a slack greater than a predetermined threshold.

* * * * *